(12) United States Patent
Mak et al.

(10) Patent No.: US 9,217,767 B2
(45) Date of Patent: Dec. 22, 2015

(54) TESTING METHOD OF A SOLAR CELL PANEL, AND TESTING APPARATUS THEREOF

(71) Applicant: SAE Magnetics (H.K.) Ltd., Hong Kong (CN)

(72) Inventors: Wing Keung Mak, Hong Kong (CN); Ho Tong Lee, Hong Kong (CN)

(73) Assignee: SAE MAGNETICS (H.K.) LTD., Hong Kong (CN)

( * ) Notice: Subject to any disclaimer, the term of this patent is extended or adjusted under 35 U.S.C. 154(b) by 103 days.

(21) Appl. No.: 13/924,931

(22) Filed: Jun. 24, 2013

(65) Prior Publication Data

US 2013/0314118 A1    Nov. 28, 2013

(30) Foreign Application Priority Data

May 27, 2013    (CN) .......................... 2013 1 0202890

(51) Int. Cl.
    *G01R 31/26*    (2014.01)
    *G01R 31/40*    (2014.01)
    *H02S 50/10*    (2014.01)

(52) U.S. Cl.
    CPC ............ *G01R 31/2605* (2013.01); *H02S 50/00* (2013.01); *H02S 50/10* (2014.12)

(58) Field of Classification Search
    None
    See application file for complete search history.

(56) References Cited

U.S. PATENT DOCUMENTS

| | | | |
|---|---|---|---|
| 7,309,850 B2 * | 12/2007 | Sinton et al. | 250/203.4 |
| 7,554,346 B2 * | 6/2009 | Kluth et al. | 324/754.03 |
| 7,733,111 B1 * | 6/2010 | Zhao et al. | 324/761.01 |
| 7,906,972 B2 * | 3/2011 | Zapalac et al. | 324/522 |
| 2011/0090089 A1 * | 4/2011 | Luo | 340/653 |
| 2011/0227598 A1 * | 9/2011 | Park et al. | 324/761.01 |
| 2012/0004868 A1 * | 1/2012 | Fafard | 702/58 |
| 2013/0141133 A1 * | 6/2013 | Kratochvil et al. | 324/761.01 |
| 2013/0222004 A1 * | 8/2013 | Nakanishi et al. | 324/754.23 |
| 2013/0265077 A1 * | 10/2013 | Yang et al. | 324/761.01 |

* cited by examiner

*Primary Examiner* — Minh N Tang
(74) *Attorney, Agent, or Firm* — Nixon & Vanderhye, P.C.

(57) ABSTRACT

A testing method of a solar cell panel of the present invention, includes steps of: (a) providing an ambient light with steady illumination to the surface of a solar cell panel to introduce a steady signal to its electrical output; (b) providing a modulation light to a given area of the solar cell panel to introduce a modulated signal to its electrical output corresponding to the given area; and (c) analyzing electrical output of the solar cell panel to obtain different electrical properties corresponding to the given area. The testing method can test the solar cell panel efficiently, detect and locate defects accurately so that the defects can be corrected and feed back to improve manufacturing process.

18 Claims, 10 Drawing Sheets

TESTING METHOD OF A SOLAR CELL PANEL, AND TESTING APPARATUS THEREOF

This application claims priority to Chinese Application No. 201310202890.X filed May 27, 2013, the entire contents of which is hereby incorporated by reference.

FIELD OF THE INVENTION

The present invention relates to solar cell panels for converting light energy into electrical power, and more particularly, to a testing method for a solar cell panel and a testing apparatus thereof, thereby testing power conversion efficiency (PCE) of a given area and detecting defects for the solar cell panel.

BACKGROUND OF THE INVENTION

As the photovoltaic industry plays an important role in clean energy gradually, manufacturers of solar cells are trying their best to improve production yield and reduce manufacturing cost at the same time. However, several defects such as crack, impurity, short circuit, low PCE etc. will be created in the solar cells during manufacturing process, which cannot be located easily by simple visual inspection. Thus it's an important and necessary process to detect and test the solar cells before they are assembled to be a solar cell panel.

For crystalline silicon (C-Si) solar cell panel, which is implemented by assembling multiple segmental solar cells in series connection, every small segment of the solar cells will be inspected and classified as different grades according to their performances before they are assembled. Commonly, conventional crack and short circuit detection of the solar cell includes photoluminescence (PL) detection and electroluminescence (EL) detection. PL detection is carried out by collecting fluorescent signals of the solar cell and applying charge-coupled device (CCD) imaging according to photoluminescence principle, then the detects such as crack, impurity, short circuit etc. will be detected by image analysis, and in turn, the quality and performance can be judged. For EL detection, it generates an electric field by applying voltage at two terminals of the solar cell, the electrons excited by the electric field impacts luminescence center thereby causing to illuminate, and then an infrared imaged of the solar cell will be captured by a CCD camera with high resolution, thereby detecting defects of the solar cell.

However, PL and EL detection in small scale is not practical for thin-film type solar cell panel such as CIGS, CdTe, a-Si solar cell panel which are normally fabricated in large panel format. Without inline inspection and defect checking, the uniformity and defect level for within these monolithically integrated solar panels can be different and various, which will impact the quality and performance of the solar cell panel and, in turn impact the final production yield.

Thus, it is desired to provide a testing method and a testing apparatus of solar cell panel to test the solar cell panel efficiently and detect defects accurately so that the defects can be corrected and fed back to improve manufacturing process.

SUMMARY OF THE INVENTION

One objective of the present invention is to provide a testing method of a solar cell panel, which can test the solar cell panel efficiently and detect defects accurately so that the defects can be corrected and fed back to improve manufacturing process.

Another objective of the present invention is to provide a testing apparatus of a solar cell panel, which can test the solar cell panel efficiently and detect defects accurately so that the defects can be corrected and fed back to improve manufacturing process.

To achieve above objectives, a testing method of a solar cell panel of the present invention, includes steps of:

(a) providing an ambient light with steady illumination to a surface of a solar cell panel to introduce a steady signal to its electrical output;

(b) providing a modulation light to a given area of the solar cell panel to introduce a modulated signal to its electrical output correspond to the given area; and (c) analyzing electrical output of the solar cell panel to obtain electrical properties correspond to the given area illuminated by the modulation light.

As an embodiment of the present invention, the step (c) further includes sub-steps of: (c1) determining the operation condition to obtain maximum rating power from the solar cell panel corresponding to the steady illumination; (c2) demodulating the modulated signal; (c3) computing power conversion efficiency of the given area illuminated by the modulation light; and (c4) mapping a profile of the power conversion efficiency.

Preferably, the sub-step (c1) further includes providing an electric loading condition to the solar cell panel thereby obtain the maximum rating power.

Preferably, the step (c) further includes amplifying the modulated signal.

Preferably, intensity variation of the modulation light in time is in simple waveform or in digital format, so that high selectivity method can be used for signal detection from the electrical output of the solar cell panel.

As another embodiment, the testing method further includes controlling the modulation light to different areas of the solar cell panel thereby scanning the solar cell panel.

Preferably, the modulation light is provided by at least one light source unit connected with a modulation controller that the electrical output of individual modulated signal from the solar cell panel can be detected separately.

Preferably, intensity of the ambient light is at an adequate level to simulate the irradiance during solar cell panel operation.

Preferably, intensity of the modulation light is at an adequate level to be detected or demodulated by electronics.

As another embodiment, it further includes correcting defects indicated from the modulated signal scanning by using chemical or physical method.

Accordingly, a testing apparatus for a solar cell panel of the present invention includes a first light source arranged for providing an ambient light with steady illumination to a surface of a solar cell panel to introduce a steady signal to its electrical output; a second light source arranged for providing a modulation light to a given area of the solar cell panel to introduce a modulated signal to its electrical output corresponding to the given area; and an analyzing module arranged for analyzing electrical output of the solar cell panel to obtain electrical properties corresponding to the given area.

As a preferred embodiment, the analyzing module includes a load unit connected with the solar cell panel for adjusting the maximum rating power from the solar cell panel corresponding to the steady illumination; a demodulation circuit connected with an output terminal of the solar cell panel for detecting the modulated signal; and a computation unit connected with the demodulation circuit for computing electrical parameters corresponding to the given area.

Alternatively, the analyzing module further includes a V/I meter connected with the output terminals of the solar cell panel.

Alternatively, it further includes a rheostat connected with an output of the solar cell panel, and a lock-in amplifier connected with the rheostat.

Preferably, intensity variation of the modulation light in time is in simple waveform or in digital format.

Preferably, the testing apparatus further includes a movement controller to control the modulation light to irradiate different areas of the solar cell panel thereby scanning the solar cell panel.

Preferably, the second light source includes at least one light source unit connected with a modulation controller that the electrical output of individual modulated signal from the solar cell panel can be detected separately.

Preferably, the intensity of the ambient light is at an adequate level to simulate the irradiance during solar cell panel operation.

Preferably, the intensity of the modulation light is at an adequate level to be detected or demodulated by electronics.

As an improved embodiment, it further includes a rectification unit for correcting defects indicated from the modulated signal scanning by using chemical or physical method.

In comparison with the prior art, the current invention includes a modulation and demodulation process that can differentiate local area opto-electrical response illuminated by the modulation light from the steady opto-electrical response contributed by other portions of the solar cell panel illuminated by the ambient light. Therefore, the electrical properties corresponding to different areas illuminated by the modulation light can be analyzed. As a result, the solar cell panel local area quality and electrical properties such as PCE can be tested and defects, such as short circuit can be detected as they are indicated by the modulated output signal scanning. The testing method of the present invention is efficient and accurate, the testing result can guide manufacturers to correct the defects and be fed back to improve the manufacturing process at the same time.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Figure 1:
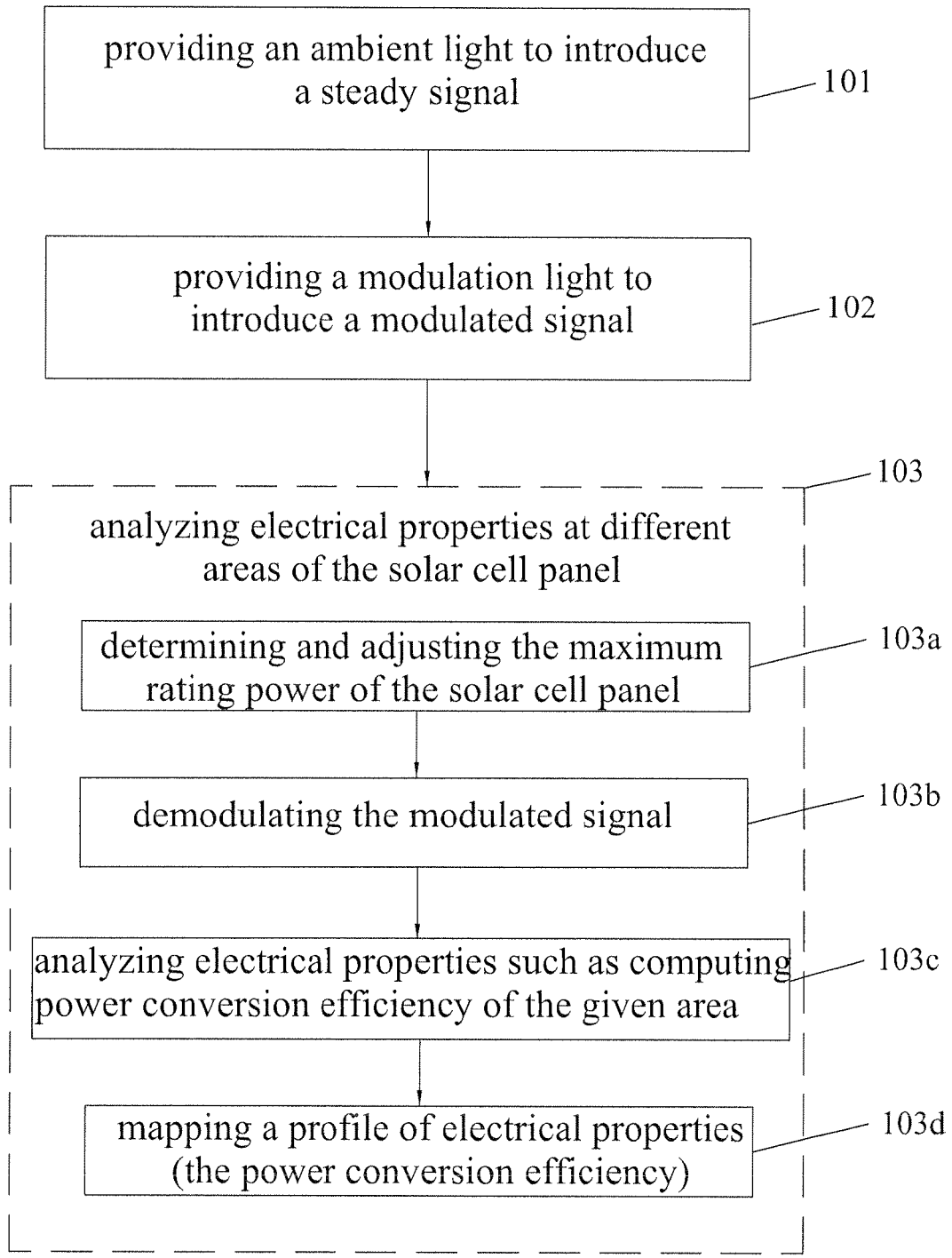
FIG. 1 is a flowchart of a testing method of a solar cell panel according to an embodiment of the present invention.

Various preferred embodiments of the invention will now be described with reference to the figures, wherein like reference numerals designate similar parts throughout the various views. As indicated above, the invention is directed to a testing method of a solar cell panel and a testing apparatus thereof, thereby testing the solar cell panel efficiently and detect defects accurately so that the detects can be corrected and fed back to improve manufacturing process.

FIG. 1 is a flowchart of a testing method of a solar cell panel according to an embodiment of the present invention. The testing method includes the following steps at least:

Step (101), providing an ambient light with steady illumination to a surface of the solar cell panel to introduce a steady signal;

Step (102), providing a modulation light to a given area of the solar cell panel so as to introduce a modulated signal; and Step (103), analyzing electrical properties of different areas of the solar cell panel in respond to the steady signal and the modulated signal.

Concretely, in the step (101), the whole solar cell panel is positioned beneath the ambient light, and the ambient light, flood lamp or solar simulator for example, with a steady incident optical power P0in provides the solar cell panel a steady electrical output signal, such as a direct current (DC) signal. In the step 102, the modulation light provides an incident modulated optical signal with power ΔPin. The intensity variation of the modulation light in time is in simple waveform or in digital format that high selectivity method can be used for signal detection. The modulation light illuminates the given area of the solar cell panel to provide a modulated electrical output signal corresponding to the illuminated area. As an embodiment, the modulation light is provided by at least one light source unit connected with a modulation controller so that electrical output of individual modulated signal from the solar cell panel can be detected separately. Specifically, the given area illuminated by the modulation light should be small enough to provide fine resolution for defect location. Preferably, the intensity of the ambient light is at an adequate level to simulate the irradiance during solar cell panel normal operation. Preferably, the intensity of the modulation light is at an adequate level to be detected or demodulated by electronics.

As a preferred embodiment of the present invention, the step (103) further includes:

Step (103a), determining and adjusting the maximum rating power of the whole solar cell panel corresponding to the steady ambient light. Concretely, an electric loading is connected with the output terminals of the solar cell panel thereby adjusting the maximum rating power of the whole solar cell panel.

Step (103b), demodulating the modulated signal from the output terminals of the solar cell panel.

Step (103c), analyzing the electrical properties, such as computing the PCE of the given area of the solar cell panel illuminated by the modulation light.

Step (103d), mapping a profile of the electrical properties or PCE of the solar cell panel.

Alternatively, the step (103) further includes amplifying the modulated signal.

For improving the testing efficiency, the present invention further includes controlling the modulation light to different areas of the solar cell panel thereby scanning the solar cell panel. For example, the scanning control can move the modulation light along X-direction or Y-direction above the surface of the solar cell panel for the test.

Figure 2:
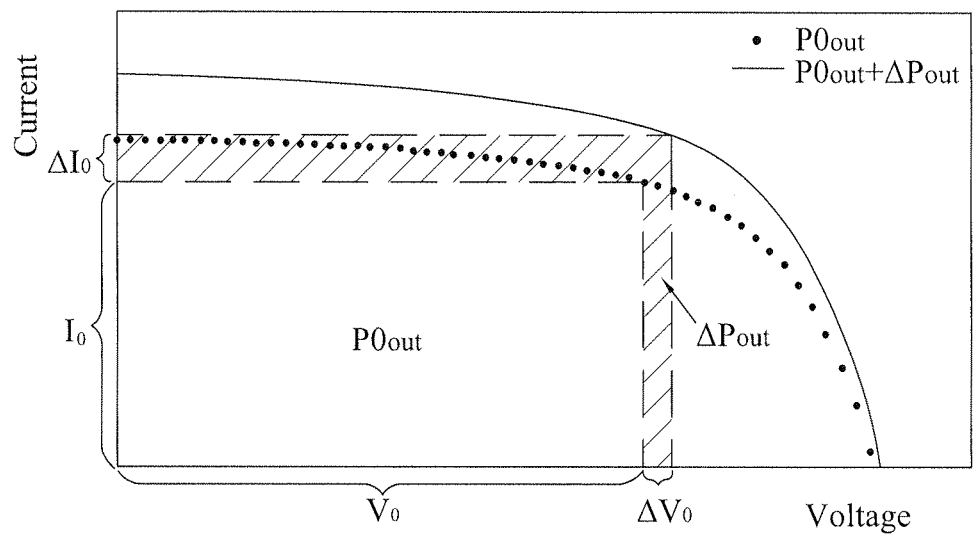
FIG. 2 is a diagram of IV curve of a solar cell with incident power changes according to the present invention.

FIG. 2 is a diagram of IV curve of a solar cell panel with the incident powers changing from P0in to (P0in+ΔPin). For the incident power P0in, the maximum power P0out of the solar cell can be calculated by the following relationship: $P0out=V0*I0$; and for the two incident powers P0in and ΔPin, the total maximum power $Pout=(V0+\Delta V0)*(I0+\Delta I0)$, thus the change of the output power ΔPout (the hatched portion as show in FIG. 2) can be calculated by the following relationship: $\Delta Pout=Pout-P0out=(V0+\Delta V0)*(I0+\Delta I0)-V0*I0=V0*\Delta I0+\Delta V0*I0+\Delta V0*\Delta I0$. In the current invention, as the electrical power generated by the given area illuminated by the modulation light is relatively small compared with the electrical power generated by the whole solar cell panel, thus the contribution from the third term of the equation ($\Delta V0*\Delta I0$) to the change in the output power ΔPout is insignificant and the equation can be rewritten as $\Delta Pout=V0*\Delta I0+\Delta V0*I0$.

Based on the calculation above, the PCE of the localized illuminated area can be calculated by $PCE=\Delta Pout/\Delta Pin$. And a PCE map at different areas of the whole solar cell panel can be obtained by controlling the modulation light to scan above the surface of the solar cell panel. Therefore, the quality and the electrical characteristic of the solar cell panel can be evaluated from the PCE map.

Figure 3:
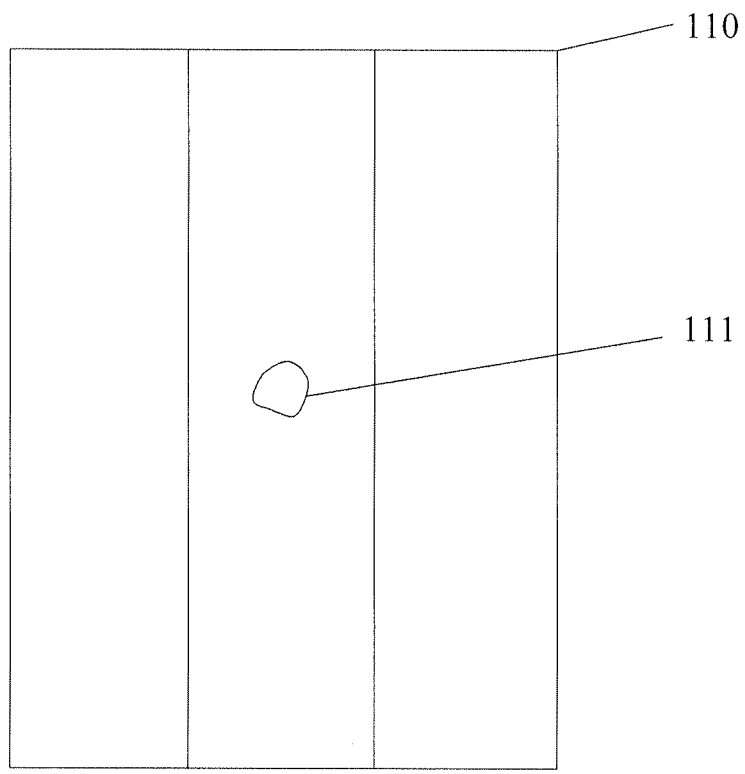
FIG. 3 is a top view of a defective solar cell panel sample experimented on the present invention.
Figure 3A:
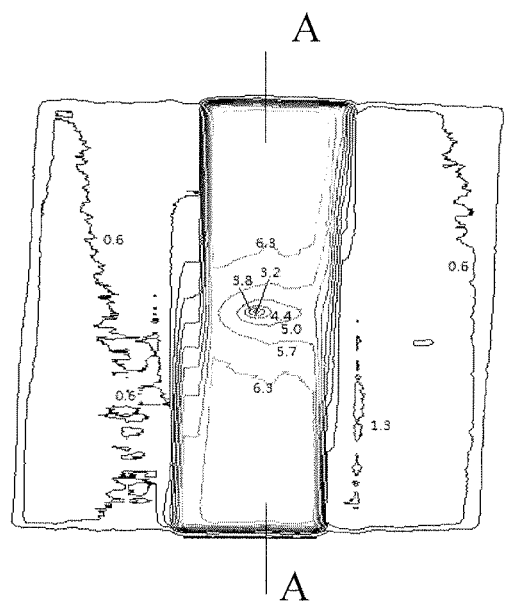
FIG. 3a is a contour map of ΔV of the defective solar cell panel sample tested by the testing method according to the present invention, before repaired.
Figure 3B:
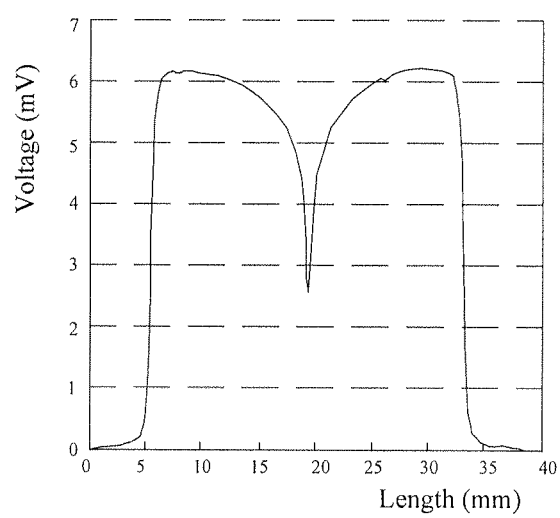
FIG. 3b is a cross section profile of the contour map shown in FIG. 3a along A-A line.

A defective solar cell panel sample will be carried out an experimental testing according to the testing method of the present invention. Specifically, as shown in FIG. 3, the defective solar cell panel 110 consists of 3 individual cells electrically interconnected in series and has a shorted circuit point 111 from top electrode to bottom electrode in the middle cell of the solar cell panel 110. FIGS. 3a~3b show the testing results, wherein FIG. 3a is a contour map of the electrical parameter ΔV (voltage change) of the defective solar cell panel sample 110 tested by the testing method according to the present invention, and FIG. 3b is a cross section profile of the contour map along A-A line. From the output voltage profiles of FIGS. 3a and 3b, a significant drop in output voltage can be observed in the contour map and the cross section, which indicates the short circuit point 111 in the solar cell panel 110. Furthermore, the performance of the area near the short circuit point 111 is also impacted due to the short circuit point 111, which reveals a trend of decreasing around the short circuit point 111. By this token, the performance of the solar cell panel can be revealed by the profiles, particularly, defects can be indicated on the electrical output changes (as an improved analysis, the electrical properties can form a PCE map. In other words, manufacturers could judge the tested solar cell panel as a defective solar cell panel according to the testing results.

Figure 4A:
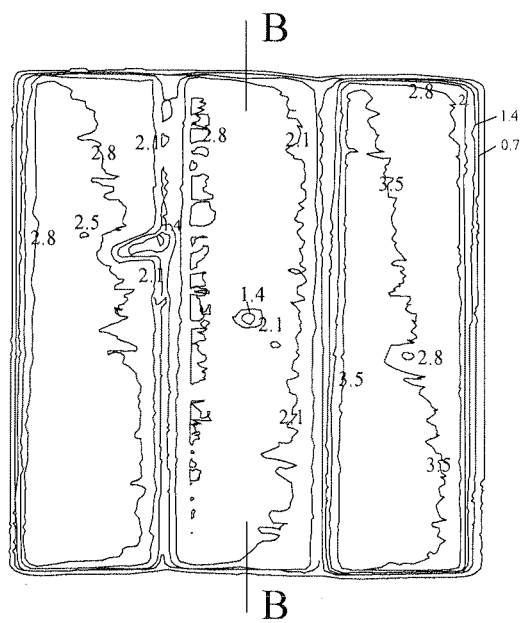
FIG. 4a is a contour map of ΔV of the defective solar cell panel sample tested by the testing method according to the present invention, after repaired.
Figure 4B:
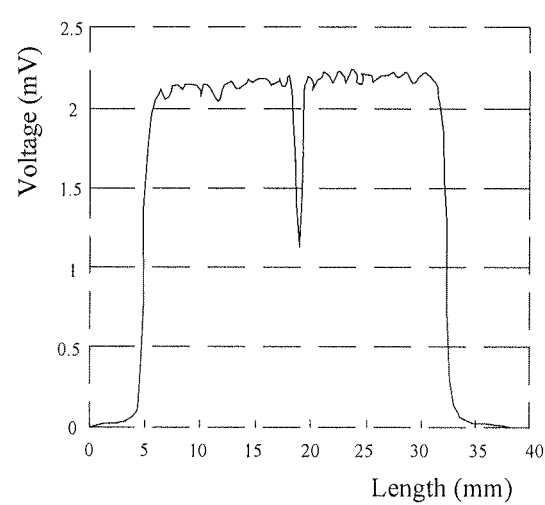
FIG. 4b is a cross section profile of the contour map shown in FIG. 4a along B-B line.

As an improved embodiment, corrections and remedies based on the testing result can be carried out by using chemical method or physical method. In the instant embodiment for the defective solar cell panel 110 with the short circuit point 111, the short circuit point 111 can be isolated from the cell's connection, for example, the short circuit point 111 is removed by certain chemical solutions or eliminated by digging. After corrected, the performance and quality of the solar cell panel 110 is improved, as shown in FIGS. 4a and 4b. FIG. 4a is a contour map of ΔV of the defective solar cell panel sample 110 tested by the testing method according to the present invention, after repaired, and FIG. 4b is a cross section view of the contour map shown in FIG. 4a along B-B line. By this token, the contour of the area near the short circuit point 111 is improved, which reveals a smooth trend at two sides of the isolating short circuit point 111.

Figure 5:
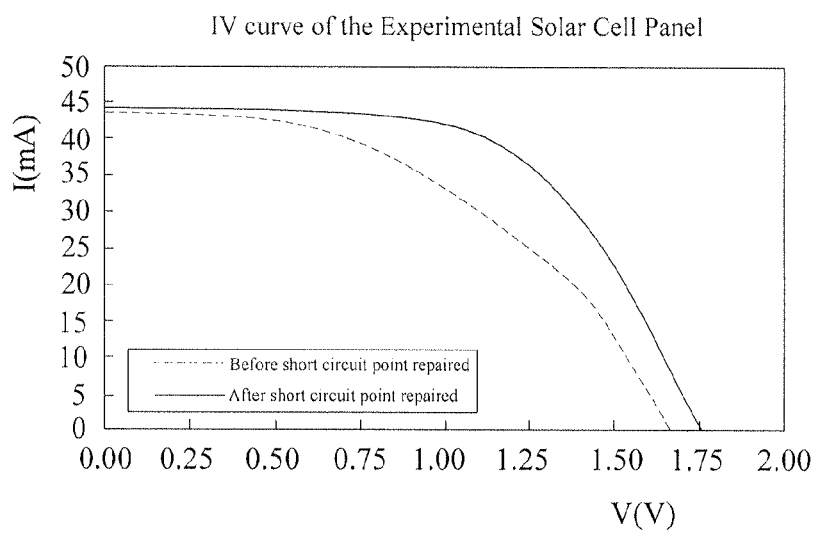
FIG. 5 is a contrast diagram of IV curves of the defective solar cell panel sample, before and after repaired.

FIG. 5 shows the contrast diagram of IV curves of the defective solar cell panel sample 110, before and after repaired, and table 1 is their performance parameters contrast.

TABLE 1

|  | Before repaired | After repaired |
|---|---|---|
| PCE (%) | 7.74 | 10.65 |
| Fill Factor (%) | 45.80 | 59.40 |
| Voc (V) | 1.67 | 1.75 |
| Isc (mA) | 43.76 | 44.17 |
| Rshunt (ohm) | 307 | 853 |

By this token, specially, the PCE of the whole solar cell panel and the shunt resistant are improved significantly due to a reduction in leakage current caused by the short circuit point.

In conclusion, the present invention includes a modulation light illuminating different locations of the solar cell panel under the panel's normal operating condition with a steady ambient light. Local area electrical properties can be detected and analyzed after the demodulation process. The quality and electrical properties such as PCE can be tested and defects such as short circuit can be detected as they are indicated on the demodulated electrical output. The testing method of the present invention is efficient and accurate, the testing result can guide manufacturers to correct the defects and be fed back to improve the manufacturing process at the same time.

It should be noticed that, the defects detected by the present invention are not limited to short circuit; any defects impacting the electrical power output of the solar cell panel can be tested and detected by the testing method of the present invention described above.

Figure 6:
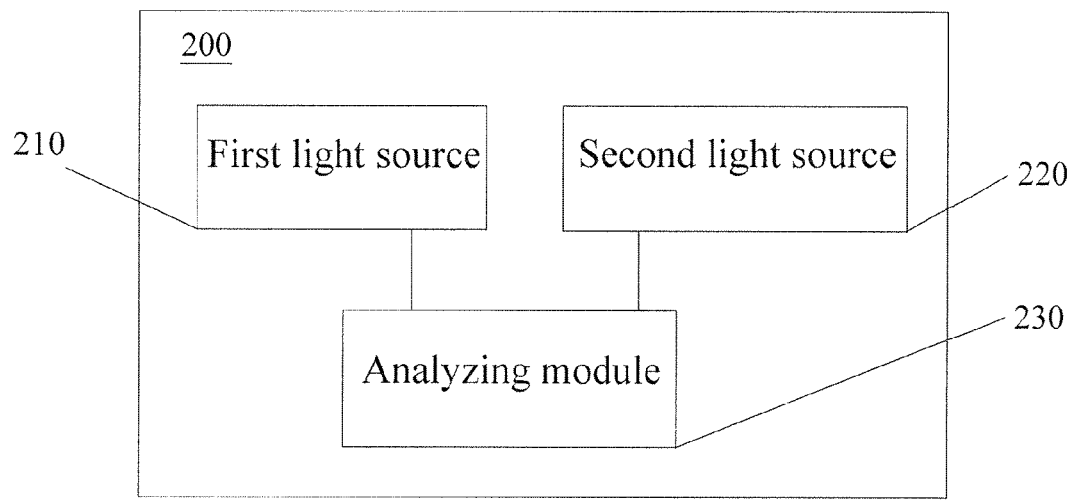
FIG. 6 is a schematic diagram of a testing apparatus of a solar cell panel according to an embodiment of the present invention.

FIG. 6 schematic diagram of a testing apparatus 200 of a solar cell panel according to an embodiment of the present invention. Concretely, the testing apparatus 200 includes a first light source 210 arranged for providing an ambient light with steady illumination to a surface of the solar cell panel 201 so as to introduce a steady signal (a DC signal for example) to its electrical output, a second light source 220 arranged for providing a modulation light to a given area of the solar cell panel 201 so as to introduce a modulated signal (a pulse signal, an AC signal, or a digital signal, for example) to its electrical output corresponding to the given area, and an analyzing module 230 arranged for analyzing electrical properties (such as electrical output) at different areas of the solar cell panel 201 responding to the modulated signal.

Figure 7A:
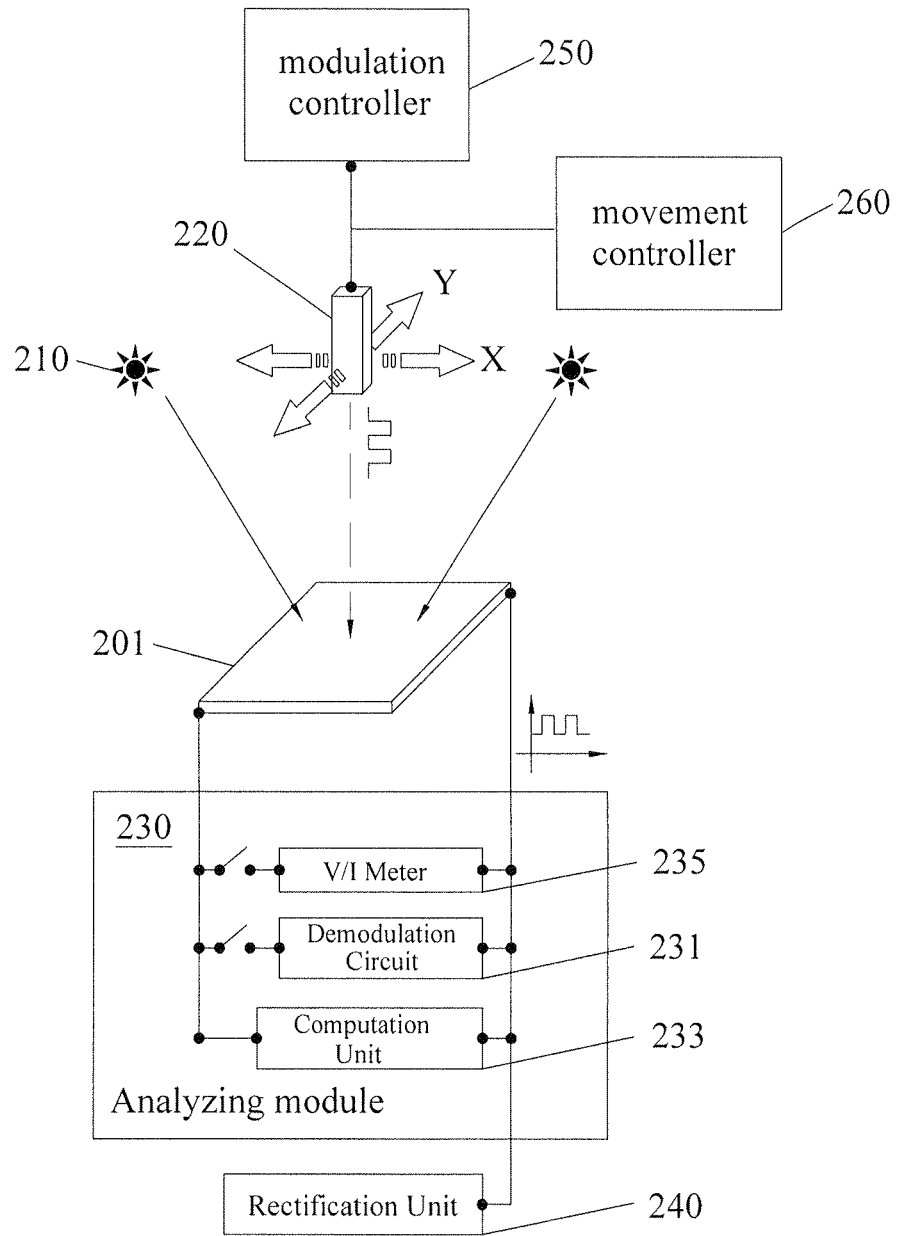
FIG. 7a is a schematic view of a testing apparatus of a solar cell panel according to a first embodiment of the present invention.

Referring to FIG. 7a, the analyzing module 230 includes a demodulation circuit 231 connected with an output terminal of the solar cell panel 201 for demodulating the modulated signal, a load unit (not shown) connected with the demodulation circuit 231 for adjusting the maximum rating power of the solar cell panel 201, a computation unit 233 connected with the demodulation circuit 231 for analyzing electrical properties and computing the PCE of given areas illuminated by the modulation light, and a mapping device (not shown) for mapping a profile of the electrical properties or PCE of the solar cell panel. Concretely, a modulation controller 250 is connected with the second light source 220 for providing the modulation light. Preferably, for facilitating to scan different area of the whole solar cell panel 201, a movement controller 260 is provided to connect with the second light source 220 thereby controlling movements along X-direction or Y-direction above the surface of the solar cell panel 201, so that the whole solar cell panel 201 can be scanned by the modulation light.

Preferably, the analyzing module 230 includes a V/I meter 235 connected with the output terminal of the solar cell panel 201 for detecting the voltage and current.

As an improved embodiment, the testing apparatus 200 further includes a rectification unit 240 for correcting defects indicated on the electrical or PCE profile.

Figure 7B:
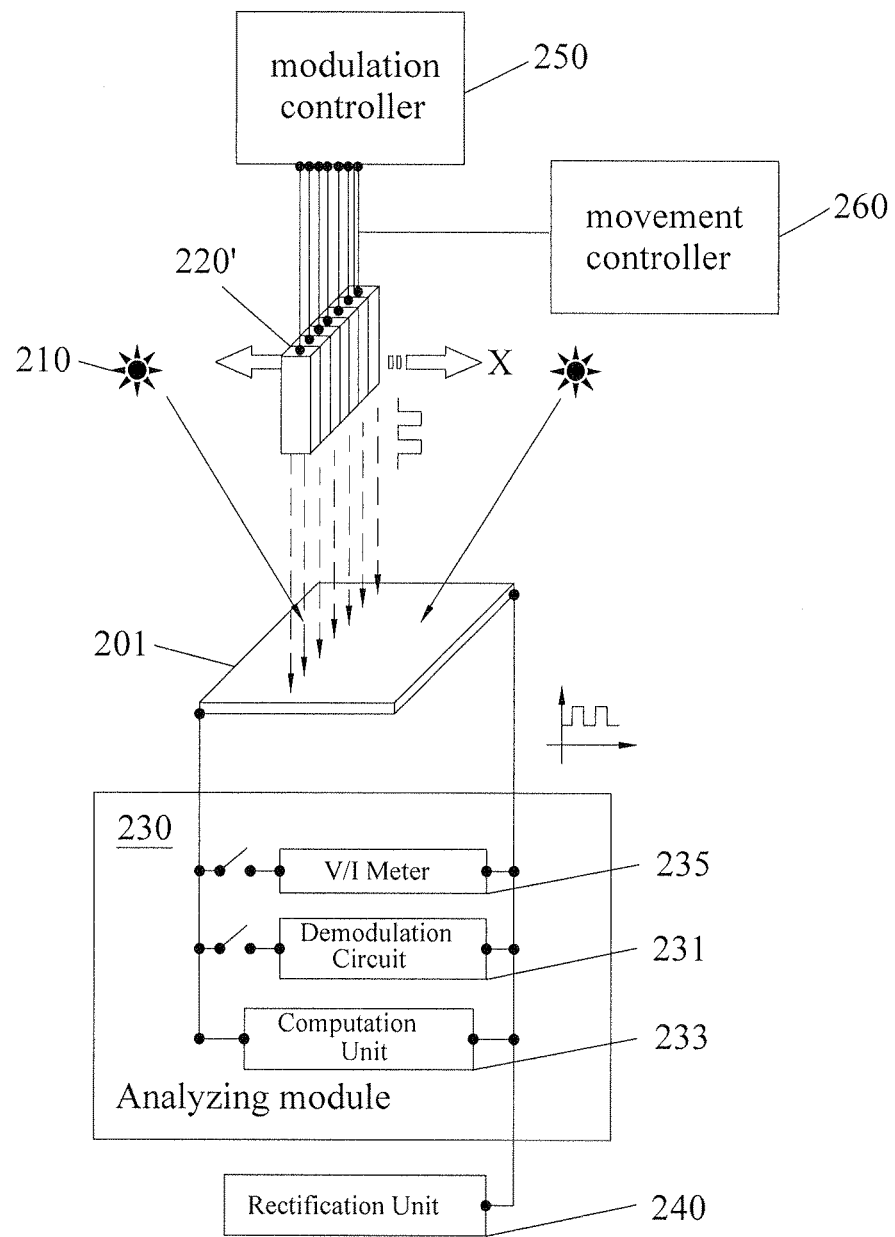
FIG. 7b is a schematic view of a testing apparatus of a solar cell panel according to a second embodiment of the present invention.
Figure 7C:
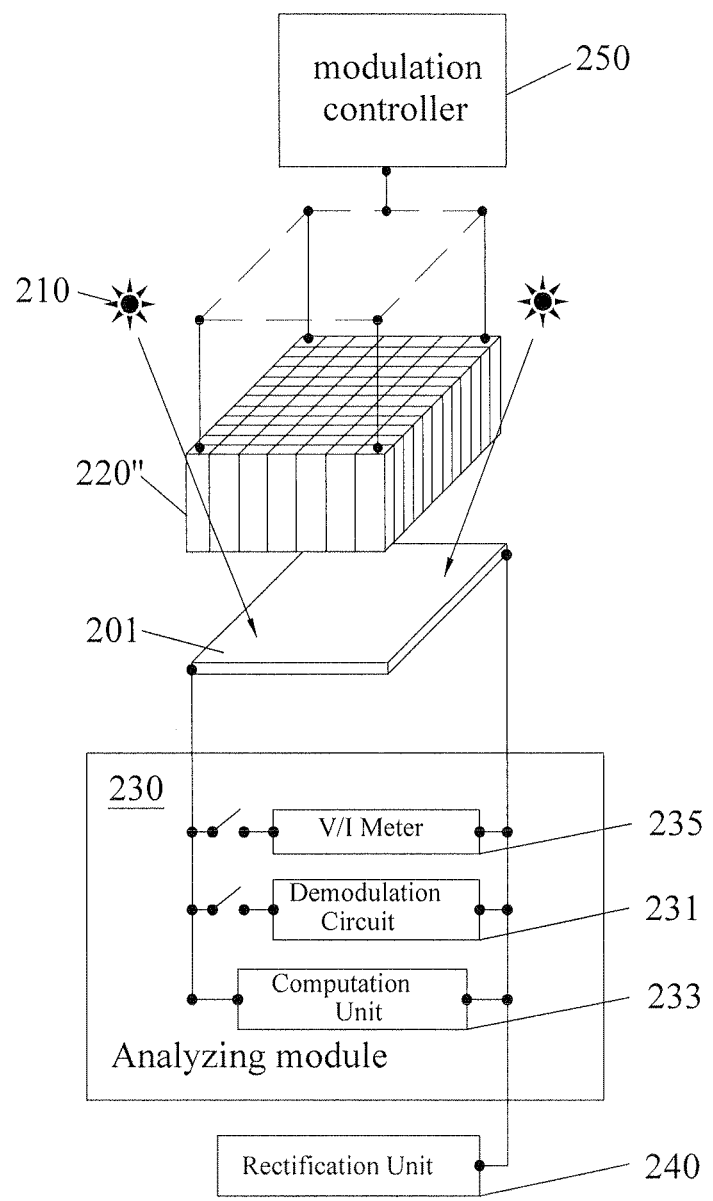
FIG. 7c is a schematic view of a testing apparatus of a solar cell panel according to a third embodiment of the present invention.

FIGS. 7b~7c show two schematic views of a testing apparatus of a solar cell panel according to a second and a third embodiments of the present invention. Differing from the first embodiment, the second light source 220' in the second embodiment is arranged by an array of light source units along X-direction or Y-direction, and the second light source 220" in the third embodiment is arranged by a matrix of light source units along X-direction and Y-direction so as to cover the solar cell panel 201 entirely, which the two improved embodiments facilitate the testing efficiency. It should be noticed that, a movement controller to control the movement of the second light sources 220" can be omitted in the third embodiment. For a more advance design of the third embodiment, the external ambient light source 210 is optional. The matrix of second light sources 220" can be programmed in a way that part of the individual light source units in the second light sources 220" operate in a steady signal (DC signal for example) to generate a steady illumination with the same intensity of the ambient light 210.

Figure 7D:
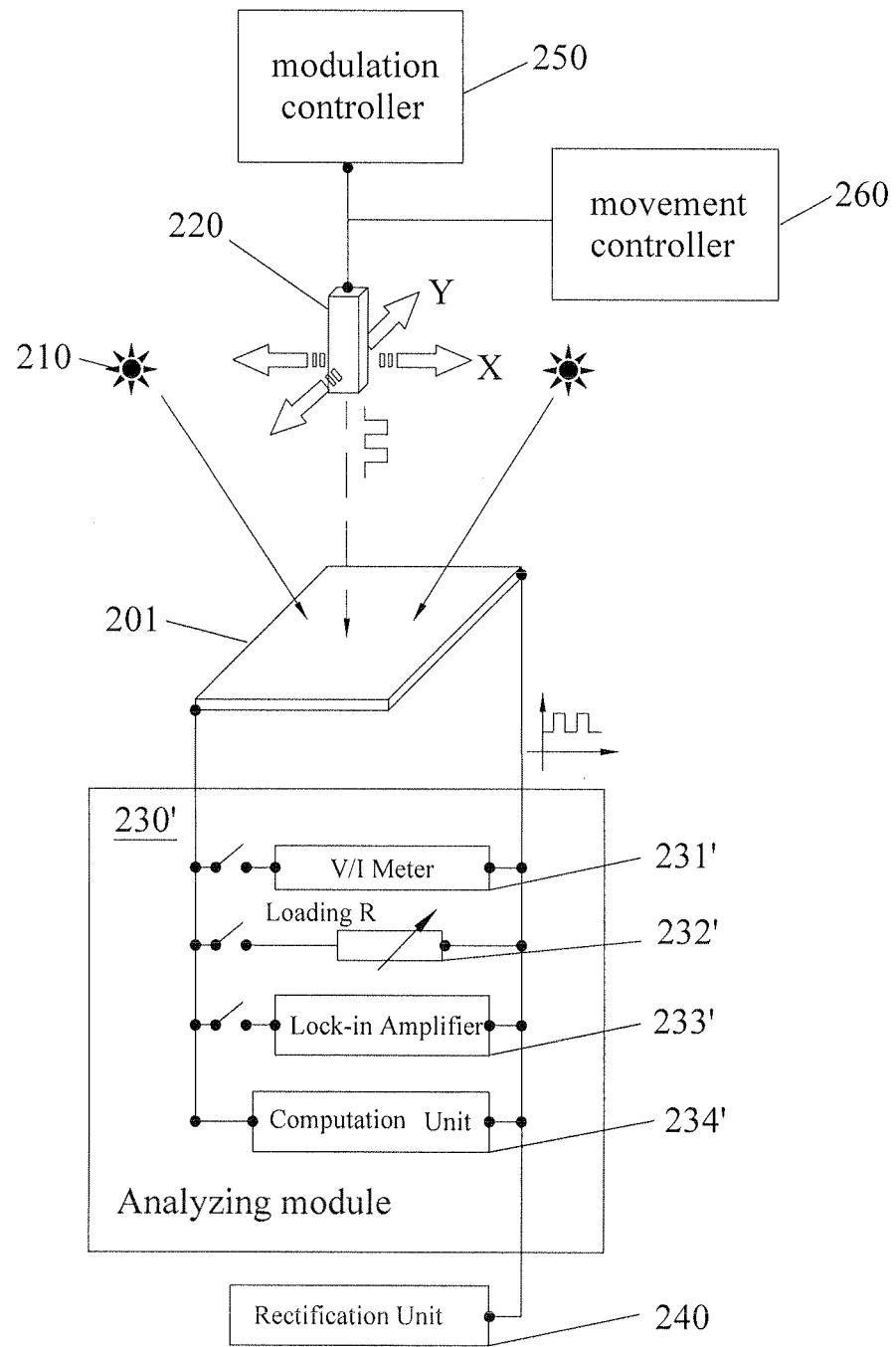
FIG. 7d is a schematic view of a testing apparatus of a solar cell panel according to a fourth embodiment of the present invention.

As an alternative embodiment based on the first embodiment, as shown in FIG. 7d, the analyzing module 230' includes an IN meter 231', a rheostat 232' as a load unit connected with the output of the solar cell panel 201 to determine the maximum rating power of the solar cell panel 201, a lock-in amplifier 233' connected with the rheostat 232' to amplify and demodulate the modulated signal, and a computation unit 234' connected with the lock-in amplifier 233' for analyzing the electrical properties and computing PCE of the given area illuminated by the modulation light and a mapping device for mapping a profile of the electrical properties or the PCE.

With the testing apparatus 200, modulated output electrical signal generated from different areas of the solar cell panel responding to the modulated signal can be mapped and analyzed, so that the quality and electrical properties such as PCE can be tested and defects such as short circuit can be detected as they are reflected on the electrical power output changes. The testing result tested by the testing apparatus 200 of the present invention is efficient and accurate, the testing result can guide manufacturers to correct the defects and be fed back to improve the manufacturing process at the same time.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A testing method of a solar cell panel including a plurality of given areas, the method comprising:
   (a) providing an ambient light with steady illumination to a whole surface of a solar cell panel to introduce a steady signal to an electrical output of the solar cell panel;
   (b) providing a modulation light to each one of the plurality of given areas of the solar cell panel to introduce a modulated signal to the electrical output of the respective given area of the solar cell panel, the modulation light being provided with the ambient light synchronously; and
   (c) analyzing electrical output of the solar cell panel to obtain electrical properties for each one of the plurality of given areas,
   wherein step (c) further comprises:
   (c1) determining the operation condition of the solar cell panel to obtain maximum rating power from the solar cell panel corresponding to the ambient light;
   (c2) demodulating the modulated signal;
   (c3) computing power conversion efficiency of the given area illuminated by the modulation light; and
   (c4) mapping a profile of the power conversion efficiency.

2. The testing method according to claim 1, wherein the sub-step (c1) further comprises providing an electric loading condition to the solar cell panel thereby obtain the maximum rating power.

3. The testing method according to claim 1, wherein step (c) further comprises amplifying the modulated signal.

4. The testing method according to claim 1, wherein intensity variation of the modulation light in time is in simple waveform or in digital format.

5. The testing method according to claim 1, further comprising controlling the modulation light to different areas of the solar cell panel thereby scanning the solar cell panel.

6. The testing method according to claim 1, wherein the modulation light is provided by at least one light source unit connected with a modulation controller so that the electrical output of individual modulated signal from the solar cell panel can be detected separately.

7. The testing method according to claim 1, wherein intensity of the ambient light is at an adequate level to simulate the sunlight during solar cell panel operation.

8. The testing method according to claim 1, wherein intensity of the modulation light is at an adequate level to be detected or demodulated.

9. The testing method according to claim 1, further comprising correcting defects indicated from the modulated signal scanning by using a chemical or a physical method.

10. A testing apparatus of a solar cell panel including a plurality of given areas, comprising:
    a first light source arranged for providing an ambient light with steady illumination to a whole surface of a solar cell panel to introduce a steady signal to an electrical output of the solar cell panel;
    a second light source arranged for providing a modulation light to each one of the plurality of given areas of the solar cell panel to introduce a modulated signal to the electrical output of the respective given area of the solar cell panel, the modulation light being provided with the ambient light synchronously; and
    an analyzing module arranged for analyzing electrical output of the solar cell panel to obtain electrical properties for each one of the plurality of given areas, wherein the analyzing module comprises:
- a load unit connected with the solar cell panel for adjusting the maximum rating power from the solar cell panel corresponding to the ambient light;
- a demodulation circuit connected with an output terminal of the solar cell panel for detecting the modulated signal; and
- a computation unit connected with the demodulation circuit for computing electrical parameters corresponding to the given area.

11. The testing apparatus according to claim 10, wherein the analyzing module further comprises a V/I meter connected with the output terminals of the solar cell panel.

12. The testing apparatus according to claim 10, further comprising a rheostat connected with an output terminal of the solar cell panel, and a lock-in amplifier connected with the rheostat.

13. The testing apparatus according to claim 10, wherein intensity variation of the modulation light in time is in simple waveform or in digital format.

14. The testing apparatus according to claim 10, further comprising a movement controller to control the modulation light to irradiate different areas of the solar cell panel thereby scanning the solar cell panel.

15. The testing apparatus according to claim 10, wherein the second light source comprises at least one light source unit connected with a modulation controller so that the electrical output of individual modulated signal from the solar cell panel can be detected separately.

16. The testing apparatus according to claim 10, wherein intensity of the ambient light is at an adequate level to simulate the sunlight during solar cell panel operation.

17. The testing apparatus according to claim 10, wherein intensity of the modulation light is at an adequate level to be detected or demodulated.

18. The testing apparatus according to claim 10, wherein further comprising a rectification unit for correcting defects indicated from the modulated signal scanning by using a chemical or a physical method.

* * * * *